(12) United States Patent
Sääski et al.

(10) Patent No.: US 10,642,433 B2
(45) Date of Patent: *May 5, 2020

(54) MULTILAYER STRUCTURE WITH EMBEDDED MULTILAYER ELECTRONICS

(71) Applicant: TACTOTEK OY, Oulunsalo (FI)

(72) Inventors: Jarmo Sääski, Oulunsalo (FI); Jarkko Torvinen, Oulunsalo (FI); Pasi Raappana, Oulunsalo (FI); Mikko Heikkinen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 16/278,299

(22) Filed: Feb. 18, 2019

(65) Prior Publication Data

US 2019/0179455 A1 Jun. 13, 2019

Related U.S. Application Data

(63) Continuation of application No. 16/156,008, filed on Oct. 10, 2018, now Pat. No. 10,248,277, which is a
(Continued)

(51) Int. Cl.
*G06F 3/044* (2006.01)
*B29C 45/16* (2006.01)
(Continued)

(52) U.S. Cl.
CPC .............. *G06F 3/044* (2013.01); *B29C 39/12* (2013.01); *B29C 45/14639* (2013.01);
(Continued)

(58) Field of Classification Search
CPC ...... G06F 3/044; G06F 3/0412; G06F 3/0416; G06F 3/017; G06F 3/03547; G06F 3/041;
(Continued)

(56) References Cited

U.S. PATENT DOCUMENTS 8,633,897 B2* 1/2014 Endo ................ G06F 3/045
345/173
10,248,277 B2* 4/2019 Saaski ................ H05K 1/185
(Continued)

FOREIGN PATENT DOCUMENTS

CN 103793100 A 5/2014
EP 1892609 A1 2/2008
(Continued)

OTHER PUBLICATIONS

Written Opinion of the International Searching Authority issued by the Finnish Patent and Registration Office acting as the International Searching Authority in relation to International Application No. PCT/FI2017/050260 dated Jul. 12, 2017 (12 pages).
(Continued)

*Primary Examiner* — Tom V Sheng
(74) *Attorney, Agent, or Firm* — Robert P. Michal, Esq.; Carter, DeLuca & Farrell LLP

(57) ABSTRACT

An integrated multilayer assembly for an electronic device includes a first substrate film configured to accommodate electrical features on at least first side thereof, said first substrate film having the first side and a substantially opposing second side, a second substrate film configured to accommodate electrical features on at least first side thereof, said second substrate film having the first side and a substantially opposing second side, the first sides of the first and second substrate films being configured to face each other, at least one electrical feature on the first side of the first substrate film, at least one other electrical feature on the first side of the second substrate film, and a molded plastic layer between the first and second substrate films at least partially embedding the electrical features on the first sides thereof.

17 Claims, 3 Drawing Sheets

Related U.S. Application Data continuation of application No. PCT/FI2017/050260, filed on Apr. 11, 2017.

(60) Provisional application No. 62/321,771, filed on Apr. 13, 2016.

(51) Int. Cl.

| | | |
|---|---|---|
| *B29C 39/12* | (2006.01) | |
| *B32B 27/08* | (2006.01) | |
| *H01L 23/538* | (2006.01) | |
| *H05K 1/02* | (2006.01) | |
| *H05K 1/18* | (2006.01) | |
| *H05K 3/28* | (2006.01) | |
| *H05K 1/03* | (2006.01) | |
| *H01L 21/56* | (2006.01) | |
| *B29C 45/14* | (2006.01) | |
| *H05K 1/14* | (2006.01) | |
| *H05K 3/12* | (2006.01) | |
| *H05K 3/36* | (2006.01) | |
| *G06F 3/0488* | (2013.01) | |
| *G06F 3/041* | (2006.01) | |
| *G06F 3/0354* | (2013.01) | |
| *G06F 3/01* | (2006.01) | |
| *B29L 31/34* | (2006.01) | |

(52) U.S. Cl.

CPC ........ *B29C 45/14819* (2013.01); *B29C 45/16* (2013.01); *B32B 27/08* (2013.01); *H01L 21/565* (2013.01); *H01L 23/538* (2013.01); *H05K 1/0266* (2013.01); *H05K 1/0274* (2013.01); *H05K 1/0313* (2013.01); *H05K 1/0393* (2013.01); *H05K 1/144* (2013.01); *H05K 1/185* (2013.01); *H05K 3/12* (2013.01); *H05K 3/284* (2013.01); *H05K 3/285* (2013.01); *H05K 3/368* (2013.01); *B29L 2031/34* (2013.01); *B32B 2457/00* (2013.01); *G06F 3/017* (2013.01); *G06F 3/03547* (2013.01); *G06F 3/041* (2013.01); *G06F 3/04883* (2013.01); *G06F 2203/04101* (2013.01); *G06F 2203/04103* (2013.01); *H01L 2924/181* (2013.01); *H05K 2201/0108* (2013.01); *H05K 2201/042* (2013.01); *H05K 2201/09118* (2013.01); *H05K 2201/09936* (2013.01); *H05K 2201/10106* (2013.01); *H05K 2201/10121* (2013.01); *H05K 2201/10151* (2013.01); *H05K 2203/1305* (2013.01); *H05K 2203/1316* (2013.01); *H05K 2203/1327* (2013.01)

(58) Field of Classification Search

CPC . G06F 2203/04101; G06F 2203/04103; B29C 39/12; B29C 45/14639; B29C 45/14819; B29C 45/16; B32B 27/08; B32B 2457/00; B32B 2457/208; H01L 21/565; H01L 23/538; H05K 1/0266; H05K 1/0274; H05K 1/0298; H05K 1/0313; H05K 1/0393; H05K 1/144; H05K 1/185; H05K 3/12; H05K 3/284; H05K 3/285; H05K 3/368; H05K 2201/0108; H05K 2201/042; H05K 2201/09936; H05K 2201/10106; H05K 2201/10121; H05K 2201/10151; H05K 2203/1316; H05K 2203/1327; B29L 2031/34

See application file for complete search history.

(56) References Cited

U.S. PATENT DOCUMENTS

| | | | |
|---|---|---|---|
| 10,401,547 B2* | 9/2019 | Keranen | H05K 1/0274 |
| 2009/0236703 A1* | 9/2009 | Shen | H01L 21/565 |
| | | | 257/666 |
| 2009/0262411 A1 | 10/2009 | Karmhag et al. | |
| 2010/0026659 A1 | 2/2010 | Long et al. | |
| 2010/0103138 A1* | 4/2010 | Huang | G06F 3/044 |
| | | | 345/174 |
| 2010/0139955 A1 | 6/2010 | Long et al. | |
| 2010/0156846 A1* | 6/2010 | Long | G06F 3/044 |
| | | | 345/174 |
| 2011/0091685 A1* | 4/2011 | Farooq | B32B 3/02 |
| | | | 428/141 |
| 2011/0096025 A1* | 4/2011 | Slobodin | G06F 3/044 |
| | | | 345/174 |
| 2011/0141055 A1 | 6/2011 | Hsu | |
| 2011/0209904 A1* | 9/2011 | Ishida | H05K 1/0222 |
| | | | 174/257 |
| 2011/0227836 A1* | 9/2011 | Li | G06F 3/0414 |
| | | | 345/173 |
| 2013/0169381 A1* | 7/2013 | Kim | H03H 7/427 |
| | | | 333/185 |
| 2014/0036428 A1 | 2/2014 | Leong et al. | |
| 2014/0037941 A1 | 2/2014 | Dorfman et al. | |
| 2014/0139762 A1* | 5/2014 | Hirakata | G02F 1/13394 |
| | | | 349/12 |
| 2015/0034370 A1* | 2/2015 | Yu | G06F 3/041 |
| | | | 174/255 |
| 2015/0085453 A1 | 3/2015 | Liberty et al. | |
| 2015/0098205 A1 | 4/2015 | Keranen et al. | |
| 2015/0116242 A1 | 4/2015 | Oh et al. | |
| 2015/0185889 A1 | 7/2015 | Nakamura | |
| 2015/0205415 A1* | 7/2015 | Nam | G06F 3/046 |
| | | | 345/174 |
| 2015/0253904 A1* | 9/2015 | Yi | G06F 3/044 |
| | | | 345/174 |
| 2015/0310776 A1 | 10/2015 | Lee et al. | |
| 2015/0363629 A1* | 12/2015 | Lee | G06K 9/0002 |
| | | | 345/173 |
| 2016/0001496 A1* | 1/2016 | Chow | G06F 3/044 |
| | | | 345/173 |
| 2016/0124534 A1* | 5/2016 | Ahn | G06F 3/041 |
| | | | 345/173 |
| 2016/0284663 A1* | 9/2016 | Ye | H01L 25/50 |
| 2016/0313858 A1* | 10/2016 | Chan | G06F 3/044 |
| 2016/0350572 A1 | 12/2016 | Kim et al. | |
| 2016/0364082 A1* | 12/2016 | Kimura | G06F 3/044 |
| 2017/0094776 A1* | 3/2017 | Heikkinen | H05K 3/4015 |
| 2017/0135198 A1* | 5/2017 | Keranen | H05K 3/284 |
| 2018/0217702 A1* | 8/2018 | Hashida | G06F 3/044 |

FOREIGN PATENT DOCUMENTS

| | | | |
|---|---|---|---|
| EP | 2209063 | A2 | 7/2010 |
| EP | 3168715 | A1 | 5/2017 |
| WO | 2015115716 | A1 | 8/2015 |
| WO | 2017077193 | A1 | 5/2017 |

OTHER PUBLICATIONS

International Search Report issued by the Finnish Patent and Registration Office acting as the International Searching Authority in relation to International Application No. PCT/FI2017/050260 dated Jul. 12, 2017 (7 pages).

Second Written Opinion of the International Searching Authority issued by the Finnish Patent and Registration Office acting as the International Searching Authority in relation to International Application No. PCT/FI2017/050260 dated Feb. 27, 2018 (10 pages).

International Preliminary Report on Patentability issued by the Finnish Patent and Registration Office acting as the International Preliminary Examination Authority in relation to International Application No. PCT/FI2017/050260 dated Jul. 12, 2017 (10 pages).

(56) References Cited

OTHER PUBLICATIONS

Extended European Search Report issued by the European Patent Office in relation to European Application No. 17781989.3 dated Jan. 29, 2020 (16 pages).

* cited by examiner

MULTILAYER STRUCTURE WITH EMBEDDED MULTILAYER ELECTRONICS

CROSS-REFERENCE TO RELATED APPLICATIONS

This application is a continuation of U.S. application Ser. No. 16/156,008 filed Oct. 10, 2018, which is a continuation of PCT International Application No. PCT/FI2017/050260 filed Apr. 11, 2017, which claims priority to U.S. Provisional Patent Application No. 62/321,771, filed Apr. 13, 2016, the disclosure of each of these applications is expressly incorporated herein by reference in their entirety.

FIELD OF THE INVENTION

Generally the present invention pertains to multilayer structures in connection with electronics, associated devices, and related methods of manufacture. In particular, however not exclusively, the present invention concerns provision of functional elements such as electronics in the multilayer stack.

BACKGROUND

Generally there exists a variety of different stacked assemblies and structures in the context of e.g. electronics and electronic products such as various electronic devices.

The motivation behind stacking elements in a common structure may be as diverse as the related use contexts. Relatively often size savings, weight savings, cost savings, usability benefits, or just efficient integration of components in terms of e.g. the manufacturing process or logistics is sought for when the resulting optimized solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle and particularly automotive electronics, etc.

Electronics such as electronic components, ICs (integrated circuit) and conductors may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not necessarily always the case.

A substrate such as a plastic substrate film, may be subjected to processing, e.g. (thermo)forming or molding. Indeed, using e.g. injection molding a plastic layer may be provided on the film, potentially then embedding a number of elements such as electronic components present on the film. The plastic layer may have different mechanical, optical, electrical, electrical, etc. properties. The obtained multilayer, or stacked, structure may be configured for a variety of purposes depending on the included features, such as electronics, and the intended use scenario and related use environment. It may, for instance, comprise one or more connecting features such as fluke type protrusions for coupling with compatible recesses of a host element or vice versa.

As the electronics may not, however, always be a critical or sole feature of highest priority or of most importance in the associated product, and they may actually be considered supplementary, optional features only, the design and implementation of features providing the desired electrical effect shall be carefully executed. Weight and size requirements, elevated power consumption, additional design considerations, new process steps, and generally increased overall complexity of the manufacturing phase and the resulting product are all examples of numerous drawbacks easily becoming materialized as a side effect of adopting various electronic features in the target solution.

In the light of the foregoing, in many real-life manufacturing scenarios fitting all the desired electronic or generally electrical features on a substrate film has turned out very challenging if not impossible due to the limited surface area available for mounting or producing the features thereon and e.g. the necessary physical separation some elements should in any case have to function in optimal or even proper manner. Further, in some applications placing several features on a common substrate either adjacent to each other or at a distance is sub-optimum in any case as the resulting rather limited spatial separation of the features reduces the achievable spatial resolution of the implemented functionality, which may be a sensing functionality, for instance.

SUMMARY

The objective of the present invention is to at least alleviate one or more of the above drawbacks associated with the existing solutions in the context of various devices or other host elements that are to be provided with embedded electrical, such as electronic, features.

The objective is achieved with the embodiments of a multilayer assembly and a related method of manufacture in accordance with the present invention.

According to one embodiment of the present invention, an integrated multilayer assembly for an electronic device comprises a preferably flexible first substrate film configured to accommodate electrical features, such as conductive traces and electronic components, e.g. SMDs (surface-mount device), on at least first side thereof, said first substrate film having the first side and a substantially opposing second side, a preferably flexible second substrate film configured to accommodate electrical features, such as conductive traces and electronic components on at least first side thereof, said second substrate film having the first side and a substantially opposing second side, the first sides of the first and second substrate films being configured to face each other, at least one electrical feature on the first side of the first substrate film, at least one other electrical feature on the first side of the second substrate film, and a molded plastic layer between the first and second substrate films and at least partially embedding the electrical features on the first sides thereof.

The films may be adjacent to and contact the molded layer. Preferably the layer has been molded in between the films so that the films and the layer are attached together and establish the stacked multilayer assembly.

In one embodiment at least one aforesaid electrical feature on either or both substrate films comprises or defines an electrode for sensing. The one or more electrodes may be utilized as a part of a capacitive gesture and/or touch sensing arrangement, for example. Thus, at least two stacked and optionally overlapping (in the thickness direction of the assembly) electrodes, preferably at least one on each film, may constitute at least part of an electrode structure for the purpose of detecting e.g. touch or 3d gestures upon or more generally in the vicinity of the multilayer assembly.

In one, either supplementary or alternative, embodiment, either or both of the substrate films is formed, e.g. thermoformed, to a desired 3d-shape. Forming may optionally take place after locating at least some of the electrical features such as electronic components on the films. Originally the films may be planar and at least some of the features may be positioned to selected locations thereon prior to shaping. Preferably the locations are selected so that the subsequent forming does not direct excessive stress thereto to avoid breakage of the already-positioned features or their mutual connections such as traces on the substrate.

In some embodiments, the features on either or both films may include light sources or light detectors. For example, a number of LEDs may be positioned on the film(s). Alternatively or additionally light detectors such as photodiodes or phototransistors or photovoltaic devices may be included on the film(s) or generally within the assembly.

The plastic layer may contain optically at least translucent, optionally transparent, material having regard to a predetermined frequency or frequency band, optionally visible light. The layer may establish a lightguide layer for transmitting light e.g. from an embedded light source to the environment or from the environment or embedded light source to an embedded detector.

In some embodiments, the assembly may further contain at least one additional layer, such as protective, aesthetic and/or connection layer, on the second surface(s) of either or both films.

The first substrate film may be optically substantially opaque, translucent or transparent having regard to a predetermined frequency or frequency band. The film may exhibit a selected color or selected colors. Frequencies emitted by the embedded or external light sources (and potentially captured by the optional light detectors) may be absorbed, reflected or transmitted by the substrate film. Similar considerations apply to the second substrate film.

Yet, either or both of the substrate films may be provided with functional features such as electrical or particularly electronic features on the second side thereof.

In some embodiments, either or both of the substrate films may include graphics such as symbols, patterns, text, figures, etc. Such may be provided using IML/IMD (in-mold labeling, in-mold decoration) technology.

The additional layer(s) may be directly produced or laminated onto the aggregate of the substrate films and molded plastic layer therebetween. Lamination may involve application of heat, pressure and/or adhesive.

According to a further embodiment, a method of establishing an integrated multilayer assembly for an electronic device comprises obtaining a preferably flexible first substrate film configured to accommodate electrical features, such as conductive traces and electronic components, e.g. SMDs (surface-mount device), on at least first side thereof, said first substrate film having the first side and a substantially opposing second side, obtaining a preferably flexible second substrate film configured to accommodate electrical features, such as conductive traces and electronic components on at least first side thereof, said second substrate film having the first side and a substantially opposing second side, providing at least one electrical feature on the first side of the first substrate film, providing at least one other electrical feature on the first side of the second substrate film, arranging the first and second substrate films in a mold, preferably one film per mold half, so that the first sides thereof are configured to face each other in substantially spaced relation, and molding a plastic layer between the first and second substrate films and at least partially embedding the electrical features on the first sides thereof.

The molding method is preferably injection molding. The substrate films already provided with further features such as electronics may be utilized as inserts.

Different considerations presented herein concerning the embodiments of the assembly may be flexibly applied to the embodiments of the method mutatis mutandis, and vice versa, as being appreciated by a skilled person.

The utility of the present invention arises from a plurality of issues depending on the embodiment.

The obtained multilayer structure may be generally kept relatively light and compact, e.g. thin, while it remains sturdy and protects the embedded functional features and exhibits e.g. a desired appearance in terms of dimensions, shape, colors and/or graphical patterns.

Provision of two substrate films and particularly electrical features such as traces, electrodes, electronic components and/or generally elements on both of them yields significant benefits in terms of installation space or surface area available and overall spatial configurability. For example, one or more electrode pads or electrode areas established from e.g. conductive printed material may be provided to both films in a spatially desired fashion (e.g. at least partially overlapping in the thickness direction of the assembly, i.e. in the direction proceeding through the layers of assembly), which enables, in cooperative combination, accurate capacitive sensing of user input or generally gestures, e.g. 3d-gestures, upon the assembly. Both touch and contactless gestures may be detected. Alternatively, one or more electrodes or generally sensing elements for detecting e.g. touch could be provided on the front (when in use) substrate film only to facilitate touch detection over solutions wherein the back film farther away from the touch location on the assembly surface was solely provided with a sensing element.

The used thermoplastic molding material may be optimized for various purposes including securing electronics in view of the molding process. Yet, the molded material optionally together with other used materials may be configured to protect the embedded features such as electronics from e.g. environmental conditions such as moisture, heat, cold, dirt, shocks, etc.

In case of optical applications, the optical coupling between the embedded optoelectronics such as light sources or detectors and the molded lightguide material may be strong with low loss and without substantial artifacts. Relative simplicity of the associated manufacturing process yields benefits own its own with reference to e.g. the related rather tolerable device and material costs, space, process time, logistic and storage requirements.

Yet, the assembly may exhibit a selected appearance or e.g. tactile feel to the viewer such as operator by the configuration of surface graphics, embedded graphics (may still be visible e.g. through the window), surface materials with different surface profiles, general shape, etc.

The embedded features may be mounted or directly produced onto the substrate film(s) by printing. Preferred printing techniques are additive (printed electronics technology) and include e.g. screen printing, flexography and ink jetting.

The expression "a number of" may herein refer to any positive integer starting from one (1).

The expression "a plurality of" may refer to any positive integer starting from two (2), respectively.

The ordinal numbers such as "first" and "second" are herein used to distinguish one element from other element, and not to specially prioritize or order them, if not otherwise explicitly stated.

The terms "film" and "foil" are herein used generally interchangeably, unless otherwise explicitly indicated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
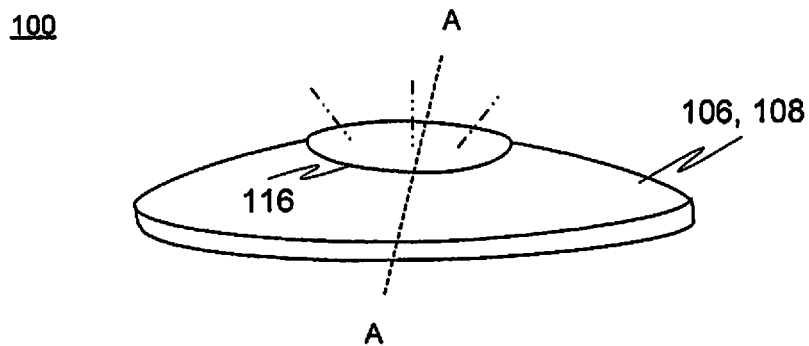
FIG. 1 illustrates one embodiment of a multilayer assembly in accordance with the present invention.

In various embodiments, either or both substrate films may contain at least one window defined by an opening, such as a through-hole, flap or cut, in the associated material layer.

The window(s) may optionally contain fill material different from the material of the film. The material is optionally optically translucent or transparent having regard to selected, e.g. visible, wavelength(s), optionally glass or plastic, such as glazing. It may define optically functional element such as a lens, prism or other refractive element, and/or a diffractive element, for example.

The window(s) may exhibit a desired indicative and/or decorative shape, such as at least partial shape of a text, number, symbol, graphical pattern, and/or figure. Yet, the window material, when applicable, may be of selected color.

In various embodiments, the material of the molded layer may establish at least part of the window filling. The material may define e.g. a protrusion from the waveguide layer that is accommodated in the window defined by the substrate film and optionally potential further adjacent layers. The molded material may in some embodiments also establish at least a part of the exterior (top) surface of the assembly.

In various embodiments, the assembly may contain further films or generally layers in addition to the molded material and substrate films on either or both sides thereof.

E.g. cover layer may be provided by at least one cover element such as a film or board, or deposited coating, on either substrate film. The cover layer may optionally also contain a window for enabling e.g. light emitted by the embedded light sources of the assembly to pass through to the environment or external light to pass into the assembly, e.g. within the molded material. The window may be aligned and at least partially overlapping with a window of the underlying substrate layer. It may be of same or different size.

The material(s) of the cover may include plastic, glass, leather, textile, organic or generally fibrous material, for example. In some embodiments, the material may be substantially translucent or transparent having regard e.g. to the wavelengths emitted by external light sources and/or internal light sources of the assembly. In some other embodiments, it may be substantially opaque. The cover may have e.g. rubber or rubberous surface. The surface material and topology (surface forms) may be optimized to provide desired feel and/or aesthetic properties in addition to or instead of e.g. insulation (e.g. moisture and/or thermal) or dampening property. The cover layer may be flexible, elastic or stiff/rigid.

The cover layer may protect the assembly and/or facilitate its attachment to a host device, for instance, if the assembly is not secured to the host via either substrate film. The cover layer or in some scenarios, directly substrate film(s), may thus contain attaching features such as adhesive material and/or mechanical fixing structure(s) e.g. in the form of boss/base, clip, hook, recess, etc. for the purpose.

Thus, depending on the used layer materials, their thicknesses, and e.g. embedded elements, the overall assembly may be generally flexible or rigid/stiff.

In various embodiments, the substrate films may contain plastic, metal, glass, leather, textile, organic and/or fibrous material (e.g. paper or cardboard). Preferably, the substrate films are or at least contain electrically insulating (dielectric) material. The substrate films may be mutually of similar or different configuration as to the used materials, their optical transparency, flexibility, hosted features such as electronics, layer thicknesses and/or shapes, for example.

The substrate films may be optically opaque, translucent or transparent having regard to selected wavelength(s). The light emitted by external or internal light sources of the assembly and later incident on the substrate may be capable of being at least partially absorbed by or penetrating (transmitting) through either or both substrate films depending on the used materials, respective refractive indices and general configuration, e.g. geometry and surface topology, of the arrangement and elements thereof. However, the substrate films may be at least locally reflective and contain reflective (surface) material e.g. in the form of coating or more thoroughly.

In various embodiments, the molded plastic layer may be optically substantially opaque, translucent or transparent having regard to the selected wavelength(s), e.g. of visible light. In some embodiments, the molded layer may be configured to act as a lightguide. It may transport light emitted by the internal light sources of the assembly, optionally provided on the substrate film(s) and at least partially embedded in the molded material, and/or external light.

In various embodiments, the substrate has been formed, preferably through thermoforming such as pressure forming, vacuum forming or hydroforming, to a desired substantially three-dimensional (non-planar), e.g. curved, angular or undulating, shape relative to its own thickness prior to or upon the provision of e.g. molded layer thereon. Electrical features, such as electronics in the form of printed electronics and/or mounted components, may have been already provided on the substrate prior to forming. The resulting 3d-shape could be several times thicker than the initial film. Additionally or alternatively, such features may have been provided to the substrate subsequent to forming.

The multilayer assembly may be generally substantially planar or flat. The order of magnitude of the width and length of the assembly may thus be different from the height (the direction in which the layers are stacked), i.e. 'thickness', which may be considerably smaller. For example, the thickness may be only a few millimeters or less whereas the width and length may be several centimeters or more, even considerably more depending on the embodiment. The thickness may be constant or it may vary considering e.g. the general shape of a discuss that the shape of the assembly may in some embodiments generally conform to.

In some embodiments, instead of or in addition to light sources, a number of light receivers or detectors, such as photodiodes, phototransistors, other suitable photoelectric elements, or e.g. photovoltaic elements (e.g. solar cell) are provided on the substrate film(s). They may be at least partially embedded through molding inside the established plastic layer. These elements are configured to capture or generally sense the light received through the substrate(s) or e.g. aforesaid window(s) and/or emitted by the internal light sources and propagated within the plastic lightguide layer. Sensing data may be utilized in adjusting the light sources, for example.

In various embodiments, the electrical features included in the assembly, as provided on the substrate film and/or on further layer(s) or element(s) thereof, may generally comprise at least one element selected from the group consisting of: conductive trace, printed conductive trace, contact pad, component, integrated circuit (chip), processing unit, memory, communication unit, transceiver, transmitter, receiver, signal processor, microcontroller, battery, light emitting device, light sensing device, photodiode, connector, electrical connector, optical connector, diode, OLED (Organic LED), printed electronic component, sensor, force sensor, antenna, accelerometer, gyroscope, capacitive switch or sensor, electrode, sensor electrode, printed electrode, printed sensor electrode, and photovoltaic cell. The features may be printed by means of printed electronics technology (e.g. screen printing or ink jetting, or other additive methods) and/or mounted. The features may be at least partially embedded e.g. in the molded lightguide layer or between different layers. Some features such as connectors, which may be arranged to supply power to the assembly, for instance, may be at least partially exposed to the environment of the assembly.

As alluded hereinbefore, the cover layer(s), associated potential window fill material(s), substrate films, molded layer and/or other elements of the assembly may have been provided with visually distinguishable, decorative/aesthetic and/or informative, features such as graphical pattern and/or color thereon or therein. The features may have been embedded in the assembly below the exterior surfaces thereof and/or provided on the exterior surface thereof. Accordingly, IML (in-mold labeling)/IMD (in-mold decoration) technique is applicable for manufacturing these features.

In various embodiments, the used mold may incorporate surface shapes that establish corresponding mirror features thereof in the molded plastic layer. The shapes/features may include e.g. a protrusion, grating, boss, boss-base, recess, groove, ridge, hole, or a cut.

With reference to the attached figures, FIG. 1 illustrates at 100 one embodiment of a multilayer assembly in accordance with the present invention, in particular exterior thereof.

The depicted, merely exemplary, assembly 100 is generally of somewhat flat or planar discuss shape with low side walls, if any. The exterior surface of the assembly 100 is at least partially defined by a substrate film 106 or optional cover layer(s) 108 thereon. Optionally a substantially transparent or at least translucent, in this example circular, window 116A may be free from material or contain a circular, substantially planar plate of transparent or translucent material, e.g. plastic or glass.

A person skilled in the art appreciates the fact the optimum shape may be determined case-specifically based on optical, dimensional (size) and aesthetic objectives.

In other feasible embodiments, the assembly 100 and related elements could bear more three-dimensional shape thus having also considerable thickness or 'height'.

The shown assembly 100 has strong (circular) symmetry around its thickness/height axis but in some other embodiments the assembly or at least one or more of its components bear different symmetry or substantially no symmetry (unsymmetrical) at all.

Figure 2:
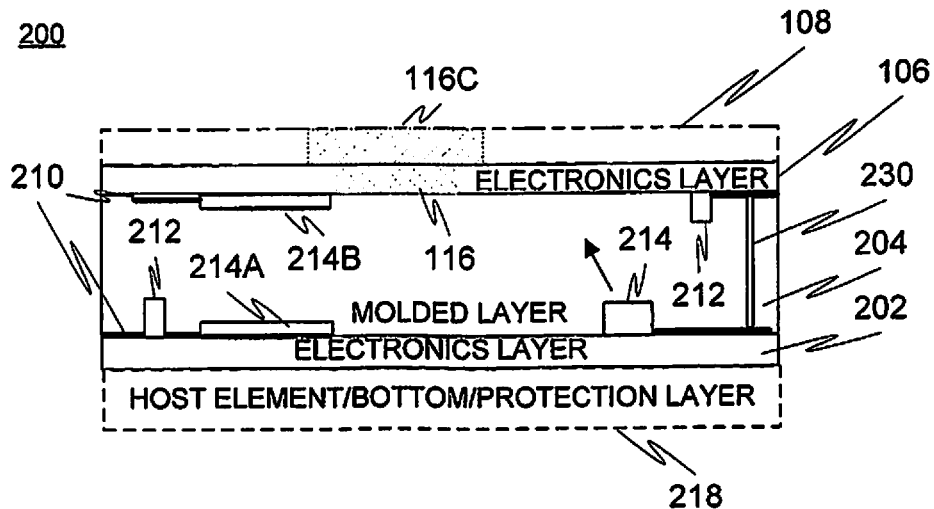
FIG. 2 is a cross-sectional side view of an embodiment of a multilayer structure in accordance with the present invention.
Figure 3:
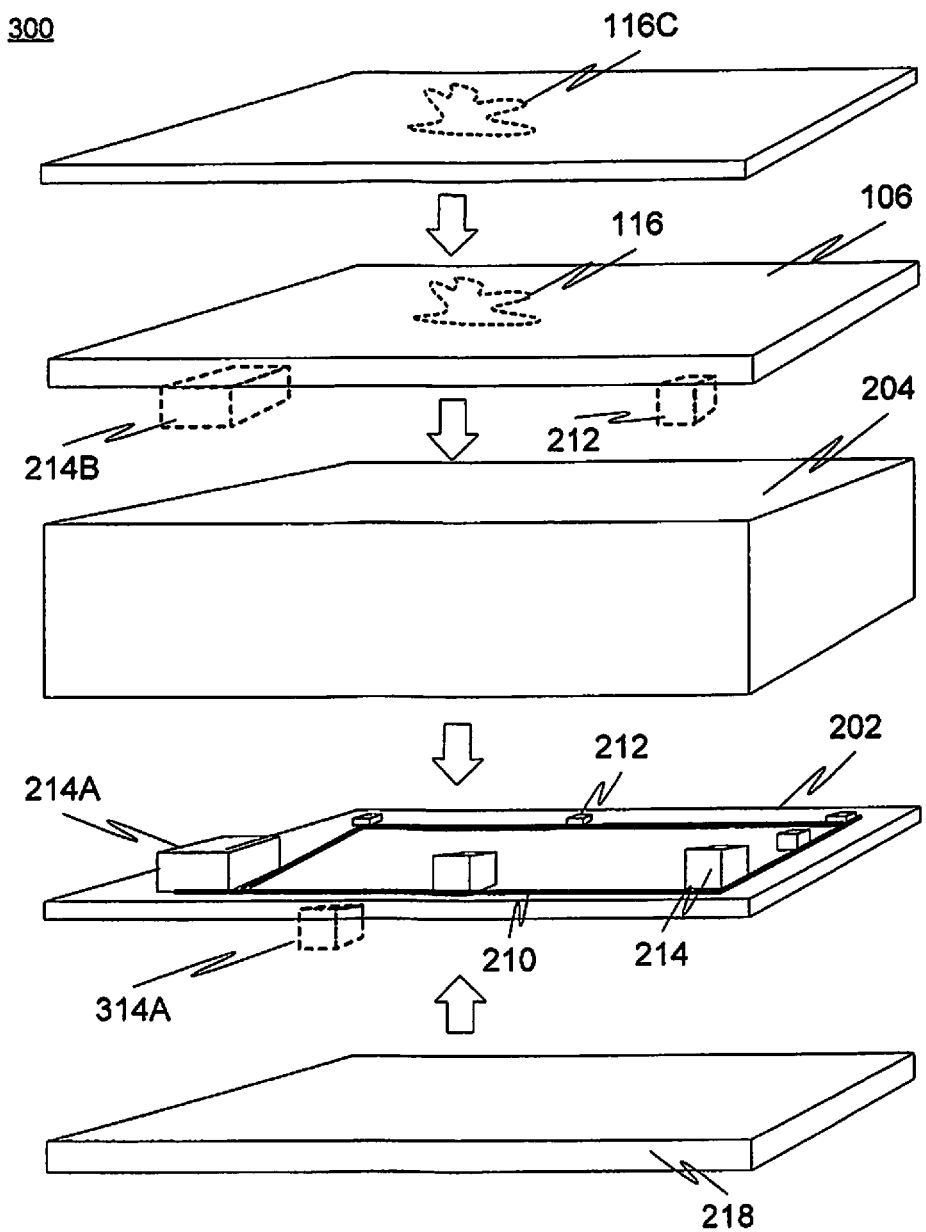
FIG. 3 illustrates conceptually one embodiment of a manufacturing process for acquiring the multilayer assembly of the present invention and related elements of the assembly.

FIG. 2 shows, via a cross-sectional side view, an embodiment 200 of a multilayer assembly according to the present invention. This mainly conceptual representation may thus cover e.g. the embodiment of FIG. 1 and various other embodiments. Having regard to FIG. 1, the view could have been taken along line A-A, for instance. FIG. 3 illustrates, at 300, essentially the same or similar embodiment especially from the standpoint of the manufacturing process and layered construction. In FIG. 3, the illustrated layer thicknesses are only exemplary but may also reflect a real-life scenario in terms of relative thicknesses. For instance, either or both substrates 106, 202 may be of film type (with e.g. about 0.1 millimetre thickness) while e.g. the molded layer 204 may be substantially thicker, e.g. one or few millimetres, or more.

The substrates 106, 202 have been provided with elements such as electrically conductive traces (conductors) 210, electrodes 214A, 214B electronic components 212, 214 such as light sources 214, light receivers/sensors, integrated circuits, etc. as mentioned hereinbefore at least on first side thereof (the top/upper surface in the figure). Additionally, such elements 314A could be provided on both sides/surfaces thereof and/or embedded therein, optionally at least partly after molding of layer 204 of preferably thermoplastic material.

The substrates 106, 202 may, besides structurally via the molded layer 204, be also functionally, e.g. electrically, connected together to enable e.g. signalling and/or current provision between them.

The connection 230 between the substrates 106, 202 may be realized through the use of conductive elements such as a metal pin, flex circuit, etc. In some embodiments, also wireless connection (e.g. rf or optical) may be applied.

The (wired) connection 230 may be established subsequent to molding or before that using e.g. applicable mold features to protect the connecting element during molding. Alternatively or additionally, e.g. a lead-through may be established for the connecting element during molding by appropriate mold feature such as a column preventing the material 204 from flowing to the space occupied by it.

As one other alternative or supplementary option, the substrates 106, 202 may be e.g. electrically connected together at the edges, optionally via electrical wiring, flex circuit or other conductors, which may enable omitting e.g. the removal of molded material 204 for the connection afterwards from a more central area of the established multilayer stack, or arranging a specific mold feature such as a column for creating a necessary lead-through.

As a further option, the molded material 204 may be machined such as drilled or otherwise processed to arrange a lead-through therein for the connection and related conductive element(s).

Power supply and/or communication connection to either substrate 106, 202 having regard to external electronics or e.g. host device electronics may be arranged generally in a similar fashion, e.g. via side contacts provided at the edge.

In some applications, instead of molding the layer 204 it could be provided otherwise with reference to e.g. a ready-made element preferably containing the necessary surface forms such as recesses for receiving and accommodating at least part of the electronics 212, 214 protruding from the first, upper, surface of the substrate 204.

The substrate 106 may be laminated to or produced on top of the molded layer 204. It 106 may contain at least one window 116, or in some embodiments, a plurality of windows as discussed hereinbefore, for enabling e.g. the light emitted by the light source 214 to be transmitted through towards the environment and/or other type of interaction with the environment optionally for sensing purposes. In some other embodiments, the substrate 202 may additionally or alternatively contain at least one such window (not explicitly represented in the figure for clarity reasons).

The window 116, layer 204 and light source 214 (and/or other relevant elements, such as light detectors/sensors) may have been configured in terms of e.g. mutual position, materials, dimensions and shape such that the light emitted by the sources 214, propagating within the layer 204 and incident on the window(s) 116 passes through the window(s) 116 at least having regard to selected incident angles.

Yet, the configuration may optionally be such that the light sources and/or other internal elements, such as additional electronics, remain hidden from the viewer substantially completely or at least within a selected inspection angle relative to a reference such as the surface normal of the assembly (i.e. the surface normal of the window fill/masking layer 106 or of potential top layer 108, or even of layer 204 in cases where there's no window fill material). The magnitude of the associated critical angle may be e.g. about 10, 15, 20, 30, 40, 45, 50, 60 or more in degrees. In some other embodiments, the reference relative to which and potentially around which, the above viewing angle is defined could differ from the above surface normal and may therefore be e.g. a line at a certain angle such as 45 deg angle therefrom.

At least one cover/top layer 108 may be optionally provided and arranged with a window 116C that may be aligned relative to the window of the substrate 106 so that the light exits the overall assembly, not just the molded layer 204 and substrate 106, to desired extent. For example, the windows 116, 116C may be substantially superimposed along the thickness/height direction of the assembly.

At least one bottom layer 218 may be optionally provided below the substrate 202 on the side opposite to the molded layer 204. The bottom layer 218 may have aesthetic (provided by e.g. graphics, surface forms, color, etc.), tactile (e.g. through surface forms, material selection), protective (material properties, thickness, flexibility/stiffness, hardness, insulation properties, etc.), connective/fixing (e.g. stickiness, adhesion, mechanical such as protrusion, recess, hook, velcro), conductive (electrically conductive material, traces, leads/wires or other conductors) and/or other function.

In some embodiments, the bottom layer(s) 218 are omitted and the assembly 200 is attached via the substrate 202 to the host device or other host element 218. As a further alternative, the assembly 200 may be of stand-alone element or device type or attach to the host or other element via other surface (e.g. via side wall(s)/edges or top surface).

In some embodiments, the assembly 200 forms at least part of a casing or cover of the host device/element. The assembly may be shaped accordingly to exhibit a generally convex, hollow, receptacle and/or container shape, for example.

The assembly 200 may be configured so as to effectuate internal reflection, preferably total internal reflection based propagation of light within the molded layer 204 acting as a lightguide. The reflection type propagation of light instead of unwanted absorption/leaking may be enhanced through using suitable materials. The layer 204 may have e.g. higher refractive index than the adjacent substrates 106, 202, bottom layer/host element surface/protection layer 218 and/or associated reflector. Yet, the location and geometry of the lightguide layer 204 relative to the light sources 214, such as top or side emitting LEDs, may be configured such that the light generally arrives at the material interfaces with angles greater than the related critical angle to ensure internal reflections as being understood by a person skilled in the art.

In some embodiments, e.g. either or both substrates 106, 202 and molded layer 204 may have substantially similar optical properties in terms of e.g. refractive index. The interface between the elements may be then considered transparent or substantially non-existing relative to the incident light and e.g. total internal reflection based propagation thereof within the then functional combination of layer 204 and substrate 106, 202.

Having regard to the potential illumination and/or light propagation features of the assembly 200, one general objective may be in providing uniform lighting, or uniform 'brightness' distribution, via the window 116 towards the environment without hotspots as mentioned hereinearlier. The directivity of the light (is it e.g. collimated or diffuse) may be determined case-specifically as well. For example, diffuse/collimating lens or other feature could be implemented by the properly shaped window fillings 116, 116C and/or other elements of the assembly. Embedded reflecting/mirroring features such as plates, films, or layer surfaces could be utilized for similar purpose.

In addition to the light projected/emitted by the assembly 200 (originated by the light sources 214) the perceived illumination uniformity of the surface also depends on the uniformity of the reflected external light.

Regarding the reflection properties of the window 116, 116C relative to external light arriving thereat from the environment of the assembly 200, the associated filling (or other element, such as the layer 204, of the assembly receiving the external light if there's no window filling in the case of e.g. through-hole type window) may incorporate an outer surface facing the environment. That surface is preferably ideally or maximally diffusive to reflect such incident light equally in every direction. This kind of diffusion property may be achieved by elevating surface roughness, for example.

To obtain the desired illumination characteristics such as uniformity, in some embodiments the assembly 200 may be configured in terms of illuminance of the window 116, 116C or the other element defining at least part of the exterior surface outcoupling the internally transmitted light to the environment and potentially reflecting external light. Constant illuminance of the window 116, 116C from the underlying layer 204 may be thus considered as one potential design objective.

Additionally or alternatively, luminance and/or luminous intensity of the window 116, 116C or the other element may be configured to be at least sufficiently (the appropriate level of sufficiency shall be naturally determined embodiment-specifically by a skilled person) constant.

Generally, the illumination properties of the assembly 200 and particularly e.g. the window 116, 116C thereof may indeed be determined by the combination of the used elements related materials, their mutual positioning, as well as dimensions and shape. The shape may cover both surface topology and overall geometry.

Figure 4:
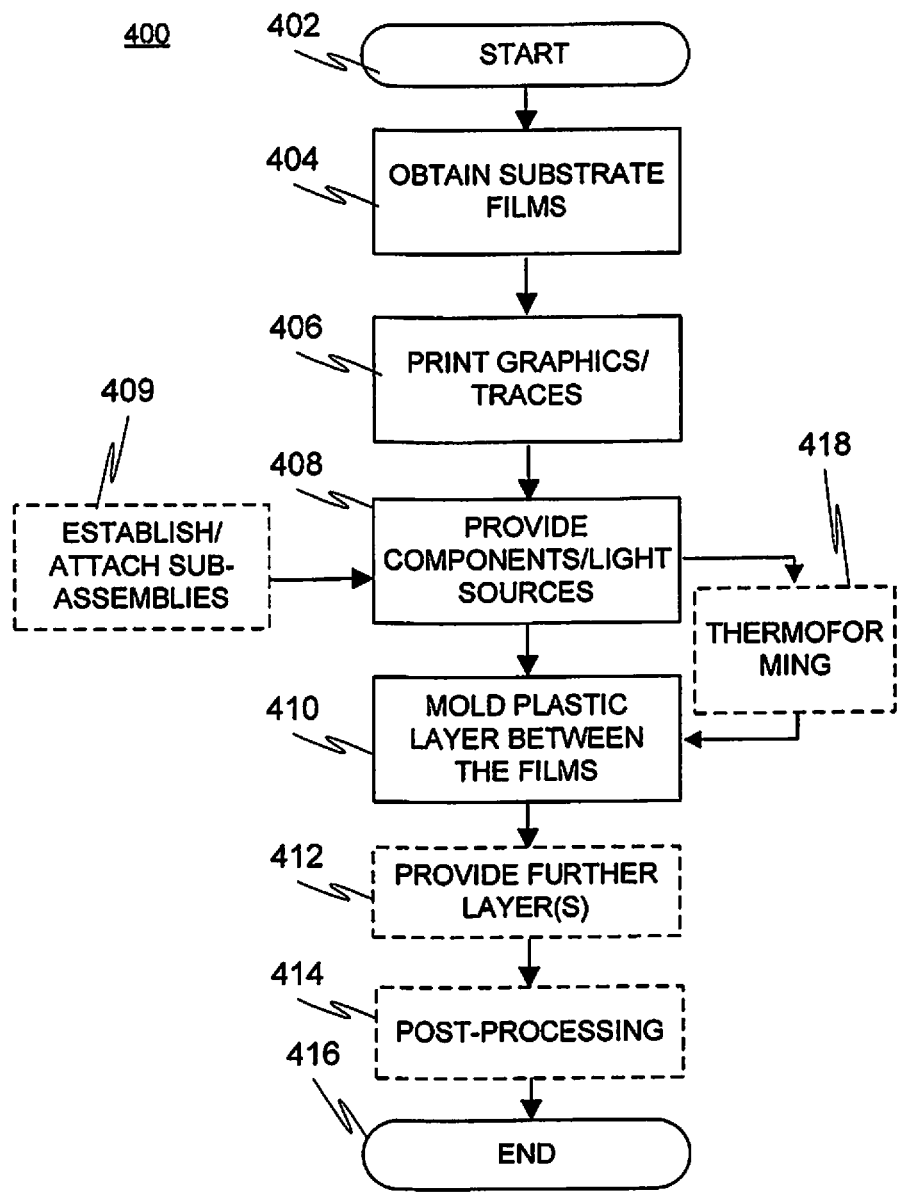
FIG. 4 is a flow diagram disclosing an embodiment of a method in accordance with the present invention.

FIG. 4 includes a flow diagram 400 disclosing an embodiment of a method in accordance with the present invention.

At the beginning of the method for manufacturing the multilayer structure, a start-up phase 402 may be executed. During start-up 402, the necessary tasks such as material, component and tools selection, acquisition, calibration and other configuration activities may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, thermoforming, cutting, drilling and/or printing equipment, among others, may be thus ramped up to operational status at this stage. Mold(s) may be prepared with necessary surface forms, etc.

At 404, preferably flexible substrate films and/or potentially other preferably planar substrate elements for accommodating electronics are obtained. A ready-made element of substrate material, e.g. a roll of plastic film, may be acquired. In some embodiments the substrate film itself may be first produced in-house by molding, extrusion or other methods from the desired source material(s). Optionally, the substrate film is processed. It may be, for example, coated, cut and/or provided with openings, notches, recesses, cuts, etc. as contemplated hereinbefore. The initial and/or resulting film may bear e.g. rectangular, square or circular shape. The substrate may be opaque, translucent or substantially transparent having regard to selected wavelengths of light or generally electromagnetic radiation, such as the operation wavelengths of the light sources or detectors to be provided thereon.

At 406, a number of conductive elements or traces defining e.g. conductor lines of a desired circuit pattern or circuit design, electrodes, contact pads (or other contact areas), etc. for electrically coupling electronic components, are provided on either or both substrate films, preferably by one or more techniques of printed electronics with reference to related additive technologies. For example, screen, inkjet, flexographic, gravure or offset lithographic printing may be utilized. Also further actions cultivating the film(s) involving e.g. printing of graphics, visual indicators, etc. may take place here.

At 408, a number of electronic elements or components, such as processing elements, communication elements, memory elements, sensing elements, and/or light sources such as LEDs may be provided on either or both substrate films and related surfaces. In practice, e.g. ready-made components such as various SMDs may be attached to the selected contact areas by solder and/or adhesives. Alternatively or additionally, printed electronics technology may be applied to actually manufacture at least part of the components, such as OLEDs, directly onto the film(s).

In some embodiments, either or both substrate films may be formed to exhibit a desired 3d-shape (a substantially non-planar shape), preferably through thermoforming 418 such as vacuum or pressure forming. The substrate containing thermoformable material may be shaped to better fit the host device or use scenario. Additionally or alternatively, thermoforming could even take place after molding 410 in case the already-established multilayer stack is designed to survive such processing. Having regard to forming techniques, e.g. pressure forming may be applied to provide the substrate with very precise, sharp details. Pressure forming may be generally preferred when the substrate lacks (through-)holes that could enable undesired flow and resulting pressure drop via them.

In some embodiments, a number of sub-assemblies of electronics/sub-substrates may be provided as such to either or both substrates at 409 and secured by adhesive, for instance.

At 410, at least one thermoplastic layer optionally establishing a lightguide for the light emitted by the light sources and/or external (e.g. ambient) light is provided, preferably through molding, upon the first side of at least one of the substrate films and at least part of the electrical features thereon, such as traces and a number of electronic components. Preferably the light sources and/or other features are at least partially embedded within the molded material. In practice, one or both substrate films may be used as an insert in an injection molding process. The first side and associated surface of the substrate element may be, in some embodiments, left with one or more areas, such as borders, free from the molded plastics. In some embodiments, both sides of a substrate film may be provided with molded layer(s). The thermoplastic material used may be opaque or at least translucent. It may exhibit at least one color.

In some embodiments, both substrate films may be first inserted in their own mold halves so that the plastic layer is injected between them during actual molding. Preferably the films are located in the mold (halves) with substantially, if not completely, spaced relation to each other, i.e. with some space between them to be then occupied by the injected thermoplastic material.

Substantially spaced relation may still in some embodiments refer to scenarios wherein local areas of both films, e.g. edge areas, are in contact with each other. E.g. the afore-reviewed discuss shape may be then obtained as outcome with film edges connected or at least close to each other while the remaining portions, e.g. central portions, of the films are farther away from each other as separated by the molded plastics.

The plastic may be injected via one or more locations e.g. from the side(s) of the film(s). Thus e.g. edge injection and/or hole injection (plastic injection between the films through one or more holes in the film(s)) may be applied. Alternatively, one of the substrate films could be attached to an already-formed aggregate of the other substrate film and molded plastic layer afterwards by a suitable lamination technique.

Either substrate film could be provided with at least one hole for the afore-discussed window(s). The hole may result from cutting, drilling, carving, stamping or etching operation, for instance. During molding, the thermoplastic molding material may then enter the hole from either or both sides, optionally also proceeding to the other side of the film, and establish at least part of the window fill for at least the concerned film.

In some embodiments, there is no through-hole ready in a substrate film prior to the molding. The film may still optionally have e.g. a thinned or otherwise weakened (formed using e.g. one of the abovementioned operations) spot at the target location of the window to facilitate window formation during molding due to the pressure of the molded material. In some embodiments, the mold surface contacting the other film may have a surface feature such as a recess, perforated area, flap or pinhole thereon corresponding to the target location of the window in the film, which may facilitate forming and/or filling the window during molding. The feature thus matching and facing the desired area of the window in the film may further enable the molded material to flow via the window to the other side (i.e. mold/exterior side) of the film.

Having regard to few examples of the applicable material selections, the substrate film and/or potential further film(s) or material layers may substantially consist of or comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), and metal.

The feasible molding methods include e.g. injection molding. In case of several plastic materials, they may be molded using a two-shot or generally multi-shot molding method. A molding machine with multiple molding units may be utilized. Alternatively, multiple machines or a single re-configurable machine could be used for sequentially providing several materials. Optionally, several overmolding-applicable materials may be utilized to establish one or more molded layers, e.g. adjacent layers between the substrate films.

The (thermo)plastic material used to establish the molded layer(s) comprises optically substantially opaque, transparent or translucent material having regard to selected wavelengths enabling e.g. light emitted by the embedded light sources and/or external (e.g. ambient) light, such as visible light, to pass through it with negligible loss. The sufficient transmittance of the material at selected wavelengths may be about 60%, 70%, 75%, 85%, 90% or 95% or higher, for example, depending on the embodiment.

The plastic layer(s) provided by e.g. the aforementioned molding procedure or heat, pressure and/or adhesive based lamination to the assembly may generally incorporate e.g. elastomeric resin. In more detail, the layer(s) may include one or more thermoplastic materials that include at least one material selected from the group consisting of: PC, PMMA, ABS (Acrylonitrile butadiene styrene), PET, nylon (PA, polyamide), polypropylene (PP), polystyrene (GPPS), and MS resin.

At 412, further layer(s) may be optionally provided to the assembly. Provision may include direct manufacturing through e.g. molding, deposition/other coating method, and attaching. A window-defining cut or hole may be optionally provided in the masking and potential further layers by drilling, carving, sawing, etching, cutting (e.g. with laser or mechanical blade), or using any other feasible processing method as being understood by a person skilled in the art. Alternatively, the layer(s) may be produced with ready-made window feature through molding, for example.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

Item 414 refers to possible post-processing tasks and attachment to a host device or element.

At 416, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An integrated multilayer assembly for an electronic device comprising:
    a first substrate film configured to accommodate electrical features on at least a first side thereof, the first substrate film having the first side and a second side opposite the first side;
    a second substrate film configured to accommodate electrical features on at least a first side thereof, the second substrate film having the first side and a second side opposite the first side, the first sides of the first and second substrate films being configured to face each other;
    at least one electrical feature on the first side of the first substrate film;
    at least one other electrical feature on the first side of the second substrate film, wherein at least one of the at least one electrical feature or the at least one other electrical feature is a mounted electronic component; and
    a molded plastic layer between the first and second substrate films at least partially embedding the electrical features on the first sides thereof, wherein one of the at least one electrical feature on the first substrate film comprises a first sensing element for detecting touch on the assembly surface.

2. The assembly of claim 1, wherein the first sensing element comprises a first electrode.

3. The assembly of claim 1, wherein one of the at least one other electrical feature on the second substrate film comprises a second sensing element, the first and second sensing elements being collectively configured to detect touch or gesture.

4. The assembly of claim 3, wherein the second sensing element comprises a second electrode.

5. The assembly of claim 1, further comprising at least one protective layer on at least one of the first or second substrate films.

6. The assembly of claim 1, wherein at least one of the first or second substrate films comprises a window of optically opaque, translucent, or transparent material having regard to a predetermined frequency or frequency band.

7. The assembly of claim 1, wherein at least one of the first or second substrate films comprises a window of through-hole type with no fill material.

8. The assembly of claim 1, wherein the substrate film includes at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), and metal.

9. The assembly of claim 1, wherein the molded plastic layer includes at least one material selected from the group consisting of: PC, PMMA, ABS, PET, nylon (PA, polyamide), polypropylene (PP), polystyrene (GPPS), elastomeric resin, and MS resin.

10. The assembly of claim 1, wherein the electrical features located on the first or second substrate film comprise at least one element selected from the group consisting of: conductive trace, printed conductive trace, contact pad, component, integrated circuit (chip), processing unit, memory, communication unit, transceiver, transmitter, receiver, signal processor, microcontroller, battery, light emitting device, light sensing device, photodiode, connector, electrical connector, optical connector, diode, OLED (Organic LED), printed electronic component, sensor, force sensor, antenna, accelerometer, gyroscope, capacitive switch or sensor, electrode, sensor electrode, printed sensor electrode, and photovoltaic cell.

11. A method of establishing an integrated multilayer assembly for an electronic device comprising:

obtaining a first substrate film configured to accommodate electrical features on at least a first side thereof, the first substrate film having the first side and a second side opposite the first side;

obtaining a second substrate film configured to accommodate electrical features on at least a first side thereof, the second substrate film having the first side and a second side opposite the first side;

providing at least one electrical feature on the first side of the first substrate film;

providing at least one other electrical feature on the first side of the second substrate film, wherein at least one of the at least one electrical feature or the at least one other electrical feature is a mounted electronic component;

forming at least one of the first or second substrates into a selected substantially non-planar three-dimensional shape subsequent to providing the at least one electrical feature thereon;

arranging the first and second substrate films in a mold so that the first sides thereof face each other in spaced relation; and molding a plastic layer between the first and second substrate films and at least partially embedding the electrical features on the first sides thereof.

12. The method of claim 11, wherein the provision of the at least one electrical feature comprises mounting or additively printing a first sensing element.

13. The method of claim 12, wherein the first sensing element comprises a first electrode for sensing touch or gesture upon the assembly.

14. The method of claim 13, wherein the first substrate film is configured as a front film, when in use, facing the environment and potential objects to be sensed therein.

15. The method of claim 12, wherein the provision of the at least one other electrical feature comprises mounting or additively printing a second sensing element.

16. The method of claim 15, wherein the second sensing element comprises a second electrode for sensing touch or gesture upon the assembly in combination with the first sensing element.

17. The method of claim 16, wherein the first and second sensing elements are spatially configured to overlap in the thickness direction of the assembly.

* * * * *